(12) United States Patent
Hijikata et al.

(10) Patent No.: US 8,253,492 B2
(45) Date of Patent: Aug. 28, 2012

(54) VARIABLE GAIN AMPLIFIER

(75) Inventors: Katsumasa Hijikata, Osaka (JP);
Mineyuki Iwaida, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/240,656

(22) Filed: Sep. 22, 2011

(65) Prior Publication Data

US 2012/0007680 A1   Jan. 12, 2012

Related U.S. Application Data

(63) Continuation of application No. PCT/JP2010/007110, filed on Dec. 7, 2010.

(30) Foreign Application Priority Data

Mar. 10, 2010   (JP) .................................. 2010-053678

(51) Int. Cl.
*H03G 3/10*   (2006.01)
(52) U.S. Cl. .......................... 330/285; 330/296; 330/277
(58) Field of Classification Search .................. 330/285, 330/296, 277
See application file for complete search history.

(56) References Cited

U.S. PATENT DOCUMENTS

| | | | |
|---|---|---|---|
| 6,211,737 B1* | 4/2001 | Fong | 330/282 |
| 6,424,222 B1* | 7/2002 | Jeong et al. | 330/285 |
| 6,657,498 B2 | 12/2003 | Park et al. | |
| 7,358,816 B2* | 4/2008 | Ryu et al. | 330/285 |
| 7,408,411 B2* | 8/2008 | Kim et al. | 330/284 |
| 7,649,418 B2* | 1/2010 | Matsui | 330/284 |
| 2010/0109777 A1 | 5/2010 | Arai | |
| 2010/0301948 A1* | 12/2010 | Amrutur et al. | 330/296 |

FOREIGN PATENT DOCUMENTS

| | | |
|---|---|---|
| JP | 06-237123 | 8/1994 |
| JP | 07-074549 | 3/1995 |
| JP | 10-290129 | 10/1998 |
| JP | 2007-158422 | 6/2007 |
| WO | WO 2009/016716 A1 | 2/2009 |
| WO | WO 2009/153838 A1 | 12/2009 |

OTHER PUBLICATIONS

K. Iizuka, "Trend toward Integration of RF Circuits for Television Broadcast Receivers," Document of Invited Lecture at IEICE 17th Technical Meeting on Silicon Analog RF Technologies, Sep. 29, 2008, pp. 31.

* cited by examiner

*Primary Examiner* — Patricia Nguyen
(74) *Attorney, Agent, or Firm* — McDermott Will & Emery LLP

(57) ABSTRACT

A variable gain amplifier includes a direct current (DC) blocking capacitor which receives an input signal at a first terminal, a variable amplifier unit, having a variable transistor size, which amplifies an output of a second terminal of the DC blocking capacitor, a load impedance unit coupled to an output of the variable amplifier unit, a bias resistor having a first terminal coupled to the second terminal of the DC blocking capacitor, a variable bias voltage generator which applies a variable bias voltage to a second terminal of the bias resistor, and a gain controller which provides control to decrease the variable bias voltage when an effective transistor size of the variable amplifier unit is controlled so as to increase, and provides control to increase the variable bias voltage when the effective transistor size of the variable amplifier unit control is controlled so as to decrease.

1 Claim, 16 Drawing Sheets

FIG.3

| GAIN MODE | CONTROL CODE T7,T6,T5,T4,T3,T2,T1 | EFFECTIVE SIZE OF AMPLIFIER TRANSISTORS [μm] | FIRST EMBODIMENT | | | | | CONVENTIONAL TECHNOLOGY | | | |
|---|---|---|---|---|---|---|---|---|---|---|---|
| | | | REFERENCE CURRENT [μA] | CURRENT DENSITY [μA/μm] | CURRENT CONSUMPTION [mA] | GAIN [dB] | IIP3 [dBm] | CURRENT DENSITY [μA/μm] | CURRENT CONSUMPTION [mA] | GAIN [dB] | IIP3 [dBm] |
| 1 | 0,0,0,0,0,0,1 | 1 | 30.0 | 30.0 | 0.03 | -26.5 | 13.8 | 20.0 | 0.02 | -28.5 | 6.2 |
| 8 | 0,0,0,1,0,0,0 | 8 | 29.4 | 29.4 | 0.23 | -13.5 | 13.1 | 20.0 | 0.16 | -15.4 | 6.4 |
| 32 | 0,1,0,0,0,0,0 | 32 | 27.5 | 27.5 | 0.88 | -2.8 | 11.4 | 20.0 | 0.64 | -4.2 | 6.5 |
| 64 | 1,0,0,0,0,0,0 | 64 | 25.0 | 25.0 | 1.60 | 2.4 | 9.7 | 20.0 | 1.28 | 2.5 | 7 |
| 127 | 1,1,1,1,1,1,1 | 127 | 20.0 | 20.0 | 2.54 | 7.2 | 8.2 | 20.0 | 2.54 | 7.2 | 8.2 |

FIG.6

| GAIN MODE | CONTROL CODE T7,T6,T5,T4,T3,T2,T1 | EFFECTIVE SIZE OF AMPLIFIER TRANSISTORS [μm] | SECOND EMBODIMENT ||||| CONVENTIONAL TECHNOLOGY ||||
|---|---|---|---|---|---|---|---|---|---|---|---|
| | | | VARIABLE REFERENCE TRANSISTOR SIZE [μm] | CURRENT DENSITY [μA/μm] | CURRENT CONSUMPTION [mA] | GAIN [dB] | IIP3 [dBm] | CURRENT DENSITY [μA/μm] | CURRENT CONSUMPTION [mA] | GAIN [dB] | IIP3 [dBm] |
| 1 | 0,0,0,0,0,0,1 | 1 | 10 | 30.0 | 0.03 | -26.8 | 11.5 | 20.0 | 0.02 | -28.9 | 5.5 |
| 8 | 0,0,0,1,0,0,0 | 8 | 10.3 | 29.1 | 0.23 | -13.9 | 11 | 20.0 | 0.16 | -15.8 | 5.5 |
| 32 | 0,1,0,0,0,0,0 | 32 | 11.3 | 26.5 | 0.85 | -3.1 | 9.6 | 20.0 | 0.64 | -4.6 | 5.8 |
| 64 | 1,0,0,0,0,0,0 | 64 | 12.6 | 23.8 | 1.52 | 2.1 | 8.5 | 20.0 | 1.28 | 1.2 | 6.2 |
| 127 | 1,1,1,1,1,1,1 | 127 | 15 | 20.0 | 2.54 | 6.9 | 7.1 | 20.0 | 2.54 | 6.9 | 7.1 |

FIG.10

| GAIN MODE | CONTROL CODE T7,T6,T5,T4,T3,T2,T1 | EFFECTIVE SIZE OF AMPLIFIER TRANSISTORS [μm] | THIRD EMBODIMENT ||||| CONVENTIONAL TECHNOLOGY ||||
|---|---|---|---|---|---|---|---|---|---|---|---|
| | | | BIAS VOLTAGE [mV] | CURRENT DENSITY [μA/μm] | CURRENT CONSUMPTION [mA] | GAIN [dB] | IIP3 [dBm] | CURRENT DENSITY [μA/μm] | CURRENT CONSUMPTION [mA] | GAIN [dB] | IIP3 [dBm] |
| 1 | 0,0,0,0,0,0,1 | 1 | 593 | 30.0 | 0.03 | −26.8 | 11.5 | 20.0 | 0.02 | −29.2 | 5 |
| 8 | 0,0,0,1,0,0,0 | 8 | 592 | 29.7 | 0.24 | −13.9 | 11 | 20.0 | 0.16 | −16.1 | 5.1 |
| 32 | 0,1,0,0,0,0,0 | 32 | 584 | 27.5 | 0.88 | −3.1 | 9.7 | 20.0 | 0.64 | −4.9 | 5.3 |
| 64 | 1,0,0,0,0,0,0 | 64 | 575 | 24.6 | 1.57 | 2.1 | 8.4 | 20.0 | 1.28 | 0.9 | 5.7 |
| 127 | 1,1,1,1,1,1,1 | 127 | 557 | 20.0 | 2.54 | 6.6 | 6.5 | 20.0 | 2.54 | 6.6 | 6.5 |

FIG.14

| GAIN MODE | CONTROL CODE T7,T6,T5,T4,T3,T2,T1 | EFFECTIVE SIZE OF AMPLIFIER TRANSISTORS [μm] | FOURTH EMBODIMENT | | | CONVENTIONAL TECHNOLOGY | | |
|---|---|---|---|---|---|---|---|---|
| | | | CURRENT CONSUMPTION [mA] | GAIN [dB] | IIP3 [dBm] | CURRENT CONSUMPTION [mA] | GAIN [dB] | IIP3 [dBm] |
| 1 | 0,0,0,0,0,0,1 | 1 | 0.03 | −32.2 | 10.9 | 1.00 | − | − |
| 7 | 0,0,0,0,1,1,1 | 7 | 0.21 | −15.4 | 10.8 | 1.00 | −19.9 | 3.4 |
| 31 | 0,0,1,1,1,1,1 | 31 | 0.88 | −2.8 | 10.5 | 1.00 | −2.1 | 12 |
| 63 | 0,1,1,1,1,1,1 | 63 | 1.68 | 3 | 10.1 | 1.00 | 0.2 | 3.8 |
| 127 | 1,1,1,1,1,1,1 | 127 | 2.96 | 8.1 | 9.6 | 1.00 | 2.3 | 0.9 |

VARIABLE GAIN AMPLIFIER

CROSS-REFERENCE TO RELATED APPLICATION

This is a continuation of PCT International Application PCT/JP2010/007110 filed on Dec. 7, 2010, which claims priority to Japanese Patent Application No. 2010-053678 filed on Mar. 10, 2010. The disclosures of these applications including the specifications, the drawings, and the claims are hereby incorporated by reference in its entirety.

BACKGROUND

The present disclosure relates to variable gain amplifiers (VGAs), and more particularly to low distortion VGAs having wide variable-gain ranges suitable for wireless communication devices.

With the advancement of CMOS process technologies in recent years, the performance of MOS transistors has improved dramatically. Thus, it is becoming possible to implement a receiver of a wireless communication device, which conventionally uses SiGe bipolar transistors etc. having superior high-frequency characteristics, using MOS transistors. Implementing a receiver using CMOS transistors allows the receiver and a digital demodulator using CMOS transistors to be integrated on one chip, thereby allowing cost reduction, size reduction, and reduction in power consumption of a wireless communication device. Accordingly, technology for implementing receivers using CMOS transistors has been actively studied in development of various wireless communication devices.

However, although technology for implementing television tuners, which are particularly in high demand among wireless communication devices, using CMOS transistors has been studied for years, such studies have not significantly advanced. The reason is that the television broadcast signals are broadband signals and include multiple channels, and that requirements for a high sensitivity characteristic and a high interferer-resistance characteristic make it difficult for a CMOS process using only a low supply voltage to satisfy the specifications. For example, in a television tuner for the digital terrestrial television broadcasting in Japan (Integrated Services Digital Broadcasting-Terrestrial (ISDB-T)), an input signal has a signal frequency band of 6 MHz per channel, and includes 50 channels ranging from channel 13 (473.143 MHz) to channel 62 (767.143 MHz). In addition, each reception channel is required to have a sensitivity characteristic of about −84 dBm, and at the same time, to have an interferer-resistance characteristic from 45 dBc to 60 dBc at the input level of an interference channel of −8 dBm.

In order to achieve such reception characteristics, design of a VGA (low noise amplifier) which processes a signal immediately after being received by an antenna is particularly important. That is, it would be possible to say that successful implementation of a desired tuner depends on how well a wide variable-gain range and a low distortion characteristic are achieved at a lower gain setting, while retaining a predetermined noise characteristic. However, it is very difficult that a CMOS process, in which only a low supply voltage can be used, satisfies the specification, in particular, on distortion among the required specifications.

To illustrate this in detail, a distortion characteristic of a general CMOS amplifier will be described below. FIG. 16 illustrates a circuit configuration of a general source-grounded amplifier. A signal Vin is input through a direct current (DC) blocking capacitor 1 to the gate terminal of an amplifier transistor 41, which is biased using a bias voltage generator 100 and a bias resistor 2, and then is converted into a current signal. After this, the current signal is converted into a voltage signal Vout by a load impedance unit 3.

In general, it is known that the distortion characteristic of an amplifier is improved by increasing the bias voltage supplied from the bias voltage generator 100. This will be quantitatively explained below using mathematical formulae.

Let x be the input, and let y be the output in the amplifier of FIG. 16. Then, using an approximation by a nonlinear cubic polynomial, the input versus output characteristic can be expressed by the following equation.

$$y = \alpha 1 \cdot x + \alpha 2 \cdot x^2 + \alpha 3 \cdot x^3 \quad (1)$$

An index of the distortion characteristic IIP3 can be expressed by the following equation (see, e.g., Kunihiko Iizuka, Document of Invited Lecture at IEICE17th Technical Meeting on Silicon Analog RF Technologies "Trend toward Integration of RF Circuits for Television Broadcast Receivers," Sep. 29, 2008, p. 31 (Non-Patent Document 1)). Here, gm represents the transconductance of the amplifier transistor 41, and gm" represents the second-order derivative of gm.

$$IIP3 = \sqrt{\frac{4}{3}\left|\frac{\alpha 1}{\alpha 3}\right|} \approx \sqrt{8\frac{gm}{gm''}} \quad (2)$$

Meanwhile, it is known that a drain current Ids of a MOS transistor, taking into account the velocity saturation of carrier, is given by the following equation. Here, $\mu_0$ is the mobility, $C_{OX}$ is the capacitance of the oxide layers, W is the channel width, L is the channel length, $V_{gs}$ is the gate-to-source voltage, $V_{th}$ is the threshold voltage, and $\xi$ is a coefficient. For simplicity of the equation, a variable $V_{eff}(=V_{gs}-V_{th})$ is used.

$$Ids = \frac{\mu_0 \cdot C_{ox}}{2}\left(\frac{W}{L}\right)\frac{(V_{gs}-V_{th})^2}{1+\xi \cdot (V_{gs}-V_{th})} \quad (3)$$
$$= \frac{\mu_0 \cdot C_{ox}}{2}\left(\frac{W}{L}\right)\frac{V_{eff}^2}{1+\xi \cdot V_{eff}}$$

The variables gm and gm" are respectively obtained by differentiating Ids once and three times with respect to $V_{eff}$, and can be expressed by the following equations.

$$gm = \frac{dIds}{dV_{eff}} = \frac{\mu_0 \cdot C_{ox}}{2}\left(\frac{W}{L}\right)\frac{2 \cdot V_{eff}+\xi \cdot V_{eff}^2}{(1+\xi \cdot V_{eff})^2} \quad (4)$$

$$gm'' = \frac{d^3 Ids}{dV_{eff}^3} = -3 \cdot \xi \cdot \mu_0 \cdot C_{ox}\left(\frac{W}{L}\right)\frac{1}{(1+\xi \cdot V_{eff})^4} \quad (5)$$

Substituting Equations 4 and 5 into Equation 2, the index IIP3 can be expressed by the following equation.

$$IIP3 = \sqrt{\frac{4V_{eff} \cdot (2+\xi \cdot V_{eff})(1+\xi \cdot V_{eff})^2}{3\xi}} \quad (6)$$

Equation 6 means that an increase in $V_{eff}$ improves the distortion characteristic. That is, in the amplifier of FIG. 16, an increase in the bias voltage supplied from the bias voltage generator 100 allows the distortion characteristic to be improved (see FIG. 17).

However, improvement of IIP3 by increasing $V_{eff}$ has a limit. An excessively high $V_{eff}$ will prevent the amplifier transistor 41 from operating in a saturation region due to a limit of the supply voltage, thereby significantly deteriorate the function as an amplifier, including the distortion characteristic. That is, there is an optimum value for $V_{eff}$ to maximize IIP3, and the optimum value decreases as the supply voltage decreases. Accordingly, achieving a low distortion characteristic with a low supply voltage is very difficult.

Next, a description of a VGA will be presented. FIG. 18 illustrates a circuit configuration of a general VGA. A variable bias voltage generator 101 adjusts the bias voltage supplied to the amplifier transistor 41 based on the control of a gain controller 102, thereby allowing a variable gain to be achieved.

However, a decrease in the bias voltage when a low gain has been set causes the distortion characteristic to significantly deteriorate (see FIG. 17). In order to avoid this, VGAs have been used in recent years, which are each capable of controlling the gain without decreasing the bias voltage by controlling the effective size of the amplifier transistor utilizing the switching characteristic of MOS transistors. For example, some devices achieve variable gains by each providing a variable amplifier unit having a variable transistor size in place of the amplifier transistor 41, and by changing the transistor size of the variable amplifier unit while keeping the bias voltage constant (see, e.g., U.S. Pat. No. 6,657,498 (FIG. 3(a)) (Patent Document 1)).

SUMMARY

In the first conventional example, an excessively high bias voltage causes a high bias current to flow to the variable amplifier unit when a high gain has been set, that is, when a high value is set for the transistor size of the variable amplifier unit. As a result, the power consumption increases. In addition, an increase in the voltage drop across the load impedance unit 3 prevents the voltage needed for each transistor included in the variable amplifier unit to operate in the saturation region from being ensured, which may cause the distortion characteristic to significantly deteriorate. That is, the first conventional example limits the upper limit of the bias voltage for reducing current consumption and for ensuring an operating point when a high gain has been set, and therefore the distortion characteristic cannot be much improved.

In the second conventional example, the bias current which flows to the variable amplifier unit is constant regardless of the gain setting, and thus it is difficult to ensure an operating point for the variable amplifier unit over a range from a lower gain setting to a higher gain setting, and it is difficult to ensure a wide variable-gain range. In addition, even at a lower gain setting which should essentially allow the power consumption to be reduced, the power consumption is the same as that at a higher gain setting, thereby resulting in a high power consumption.

The present invention is advantageous when a low distortion characteristic and low power consumption are desired to be achieved in a wide variable-gain range with respect to a VGA.

A VGA according to an example embodiment of the present invention includes a DC blocking capacitor configured to receive an input signal at a first terminal, a variable amplifier unit having a variable transistor size, and configured to amplify an output of a second terminal of the DC blocking capacitor, a load impedance unit coupled to an output of the variable amplifier unit, a bias resistor having a first terminal coupled to the second terminal of the DC blocking capacitor, a variable bias voltage generator configured to apply a variable bias voltage to a second terminal of the bias resistor, and a gain controller configured to provide control to decrease the variable bias voltage when an effective transistor size of the variable amplifier unit is controlled so as to increase, and to provide control to increase the variable bias voltage when the effective transistor size of the variable amplifier unit control is controlled so as to decrease.

Here, "the effective transistor size of the variable amplifier unit" refers to the total size of transistors biased so as to provide an amplification function in the variable amplifier unit. The amplification factor of the variable amplifier unit varies depending on the effective transistor size of the variable amplifier unit. That is, a higher effective transistor size of the variable amplifier unit results in a higher amplification factor of the variable amplifier unit.

A VGA according to another example embodiment of the present invention includes a plurality of DC blocking capacitors configured to commonly receive an input signal at respective first terminals, a variable amplifier unit having a plurality of amplifier transistors configured to amplify outputs of respective second terminals of the plurality of DC blocking capacitors, a load impedance unit commonly coupled to a plurality of outputs of the variable amplifier, a plurality of bias resistors respectively having first terminals coupled to the respective second terminals of the plurality of DC blocking capacitors, a variable bias voltage generator having a plurality of bias voltage generator circuits each having a constant current source and a reference transistor coupled together in series, and each configured to apply a bias voltage to a second terminal of a corresponding one of the plurality of bias resistors, and a gain controller configured to control, independently of one another, a plurality of outputs of either the variable amplifier unit or the variable bias voltage generator.

With these configurations, a lower gain mode, in which the effective transistor size of the variable amplifier unit is small, causes a higher current density of the bias current which flows into the variable amplifier unit. Thus, IIP3 in a lower gain mode is improved. Moreover, a higher gain mode, in which the effective transistor size of the variable amplifier unit is large, causes a lower current density of the bias current which flows into the variable amplifier unit. Thus, increase of the power consumption can be reduced.

BRIEF DESCRIPTION OF THE DRAWINGS

FIG. 3 is a table illustrating the properties of the VGA according to the first embodiment.

FIG. 6 is a table illustrating the properties of the VGA according to the second embodiment.

FIG. 10 is a table illustrating the properties of the VGA according to the third embodiment.

FIG. 14 is a table illustrating the properties of the VGA according to the fourth embodiment.

DETAILED DESCRIPTION

First Embodiment

Figure 1:
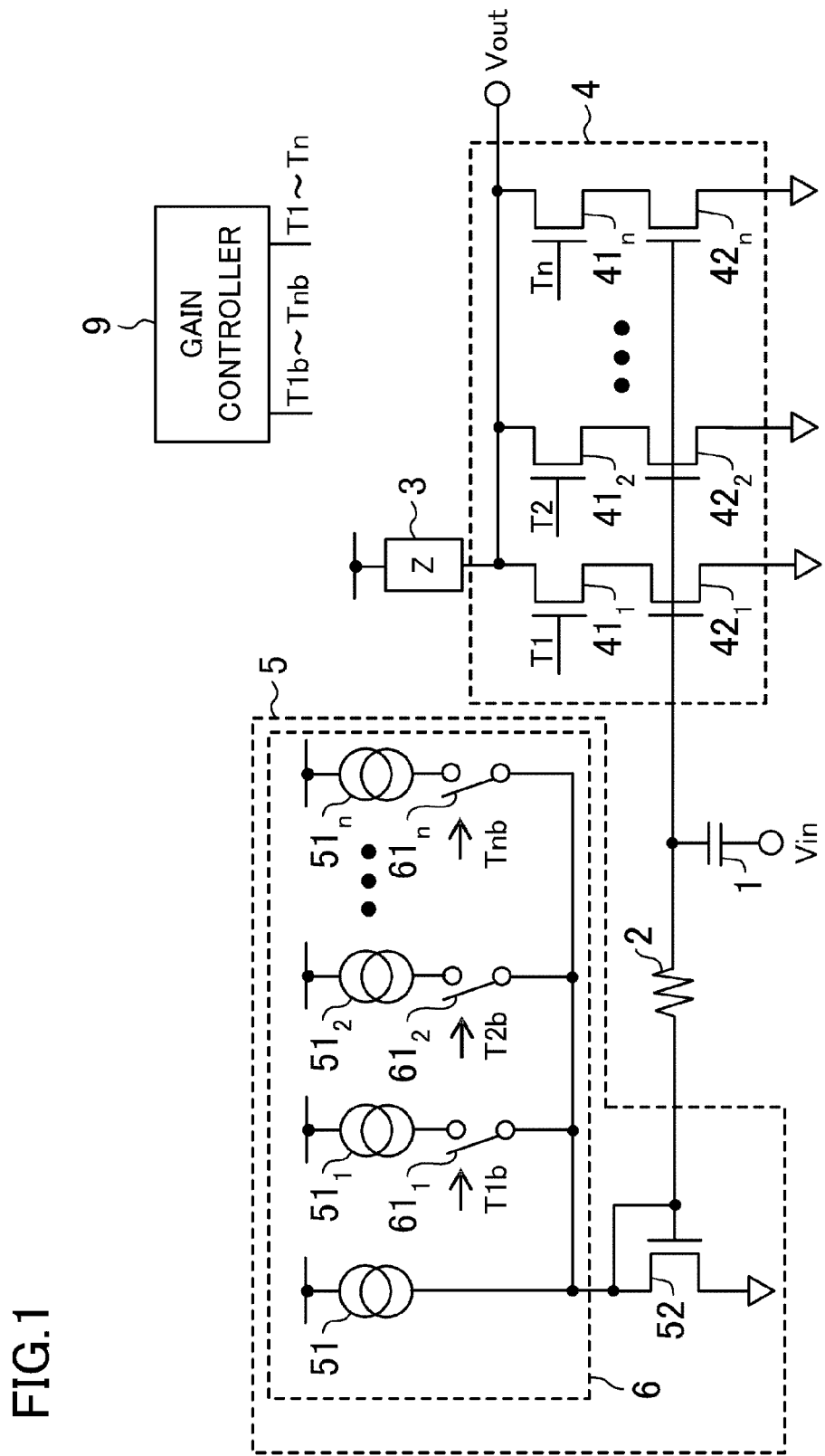
FIG. 1 is a circuit configuration diagram of a VGA according to the first embodiment.

FIG. 1 illustrates a circuit configuration of a VGA according to the first embodiment. A signal Vin is input through a DC blocking capacitor 1 to a variable amplifier unit 4, and is converted into a current signal. The current signal is converted into a voltage signal Vout by a load impedance unit 3. The input of the variable amplifier unit 4 is biased by a variable bias voltage supplied from a variable bias voltage generator 5 through a bias resistor 2.

The variable amplifier unit 4 includes a circuit in which n cascode circuits are coupled together in parallel, each having a cascode transistor $41_i$ (where $1 \leq i \leq n$) and an amplifier transistor $42_i$ which are cascode coupled. The variable bias voltage generator 5 includes a variable current source 6 and a reference transistor 52. The variable current source 6 includes a circuit in which n current source circuits are coupled together in parallel, each having a constant current source $51_i$ and a switch $61_i$ coupled together in series, and a constant current source 51 coupled in parallel to the circuit. The constant current source 51 may be omitted. The reference transistor 52 and the amplifier transistors $42_i$ together form a current mirror circuit, and a bias current dependent on the transistor size ratio thereof is supplied to the variable amplifier unit 4 with respect to a reference current supplied from the variable current source 6.

Figure 2:
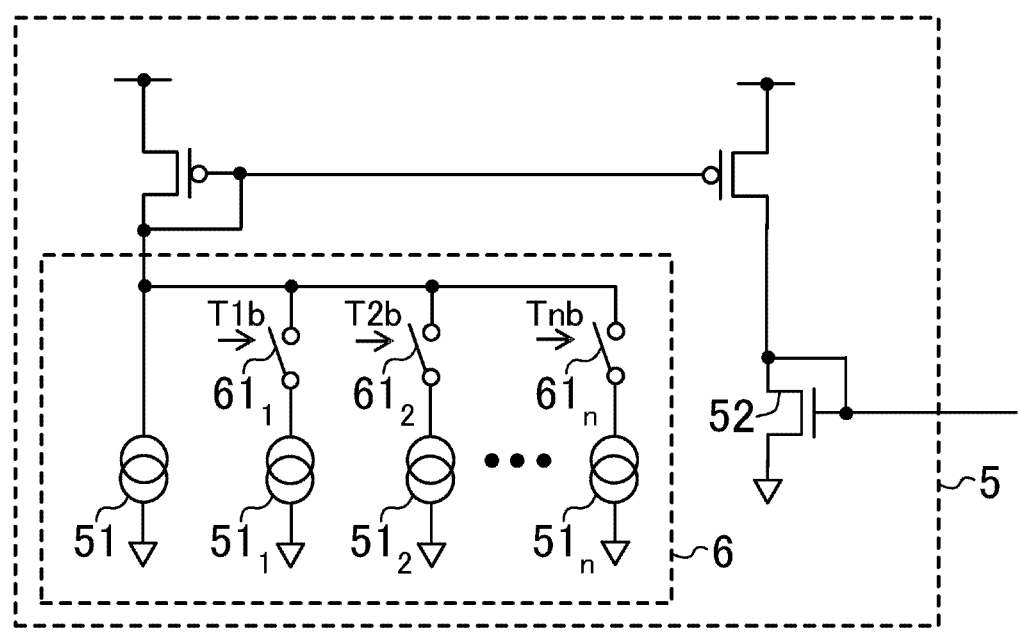
FIG. 2 is a diagram illustrating a variation of the variable bias voltage generator.

The variable current source 6 may supply a sink current as the reference current. In such a case, as shown in FIG. 2, it is preferable that the sink current supplied from the variable current source 6 be mirrored by a current mirror circuit, and thereafter be supplied to the reference transistor 52.

Returning to FIG. 1, the gain controller 9 provides control to decrease the variable bias voltage when the effective transistor size of the variable amplifier unit 4 is controlled so as to increase, and provides control to increase the variable bias voltage when the effective transistor size of the variable amplifier unit 4 is controlled so as to decrease. More specifically, the gain controller 9 outputs a control code Ti and an inverted code Tib thereof to respectively control the cascode transistors $41_i$ and the switches $61_i$. That is, the control is provided such that the switch $61_i$ is turned off when the cascode transistor $41_i$ is turned on, while the switch $61_i$ is turned on when the cascode transistor $41_i$ is turned off.

FIG. 3 is a table illustrating the properties of the VGA according to this embodiment. It is assumed here that the number of control bits is seven, that the amplifier transistor $42_i$ has a size weighed by a power of two (1 μm, 2 μm, 4 μm, 8 μm, 16 μm, 32 μm, and 64 μm), and that the reference transistor 52 has a size of 1 μm. It is also assumed that the current supplied from the variable current source 6 can be controlled in a range from 20 μA to 30 μA, that the constant current source 51 supplies a current of 20 μA, and that the total current supplied from the current sources $51_i$ is 10 μA. The current source $51_i$ supplies a current also weighed by a power of two (0.08 μA, 0.16 μA, 0.32 μA, 0.64 μA, 1.28 μA, 2.56 μA, and 5.12 μA). The table shows the control code in gain modes 1, 8, 32, 64, and 127, the effective size of the amplifier transistors, the reference current which flows to the reference transistor 52, the current density of the bias current which flows to the amplifier transistors $42_i$, the current consumption, the gain, and IIP3 when the load impedance unit 3 has a resistance of 100Ω. For the evaluation of IIP3, sinusoidal waves of 600 MHz and 610 MHz are simultaneously input, and calculations are performed using an output power of 600 MHz and an output power of 590 MHz corresponding to third-order distortion. The values of conventional technology listed for comparison with those of this embodiment are those disclosed in Patent Document 1.

Figure 4:
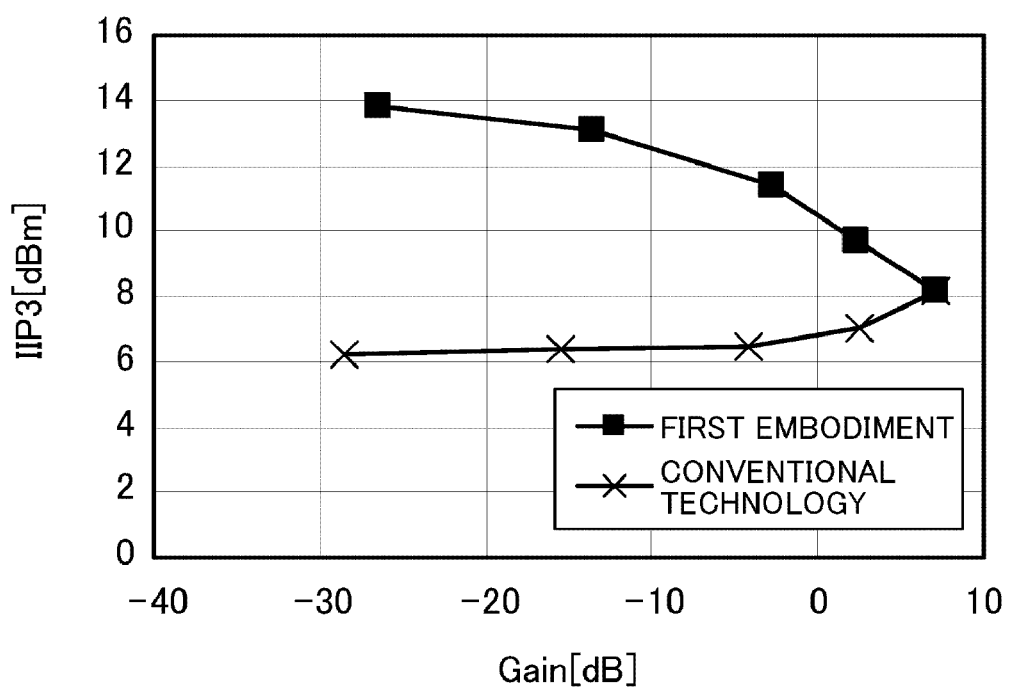
FIG. 4 is a graph illustrating a gain versus IIP3 characteristic of the VGA according to the first embodiment.

As seen from the table, the VGA according to this embodiment operates such that a lower gain causes a higher reference current, and thus a higher current density. Accordingly, IIP3 in a lower gain mode is improved as compared to that of conventional technology. As shown in the graph of FIG. 4, a lower gain in this embodiment produces a larger effect of improving IIP3. More specifically, improvement of up to about 8 dB is achieved.

The number of the cascode transistors $41_i$ and the number of the switches $61_i$ may differ. It is only required that the variable amplifier unit 4 and the variable current source 6 be configured such that an increase of the effective transistor size of the variable amplifier unit 4 causes the variable bias voltage to decrease, and a decrease of the effective transistor size of the variable amplifier unit 4 causes the variable bias voltage to increase.

Although, in this embodiment, the variable amplifier unit 4 has been described as a common-source variable amplifier unit, the variable amplifier unit 4 may be implemented using a common-gate variable amplifier unit. Moreover, in a case of a differential circuit, the variable amplifier unit 4 may be implemented using a cross-coupled common-gate variable amplifier unit.

Second Embodiment

Figure 5:
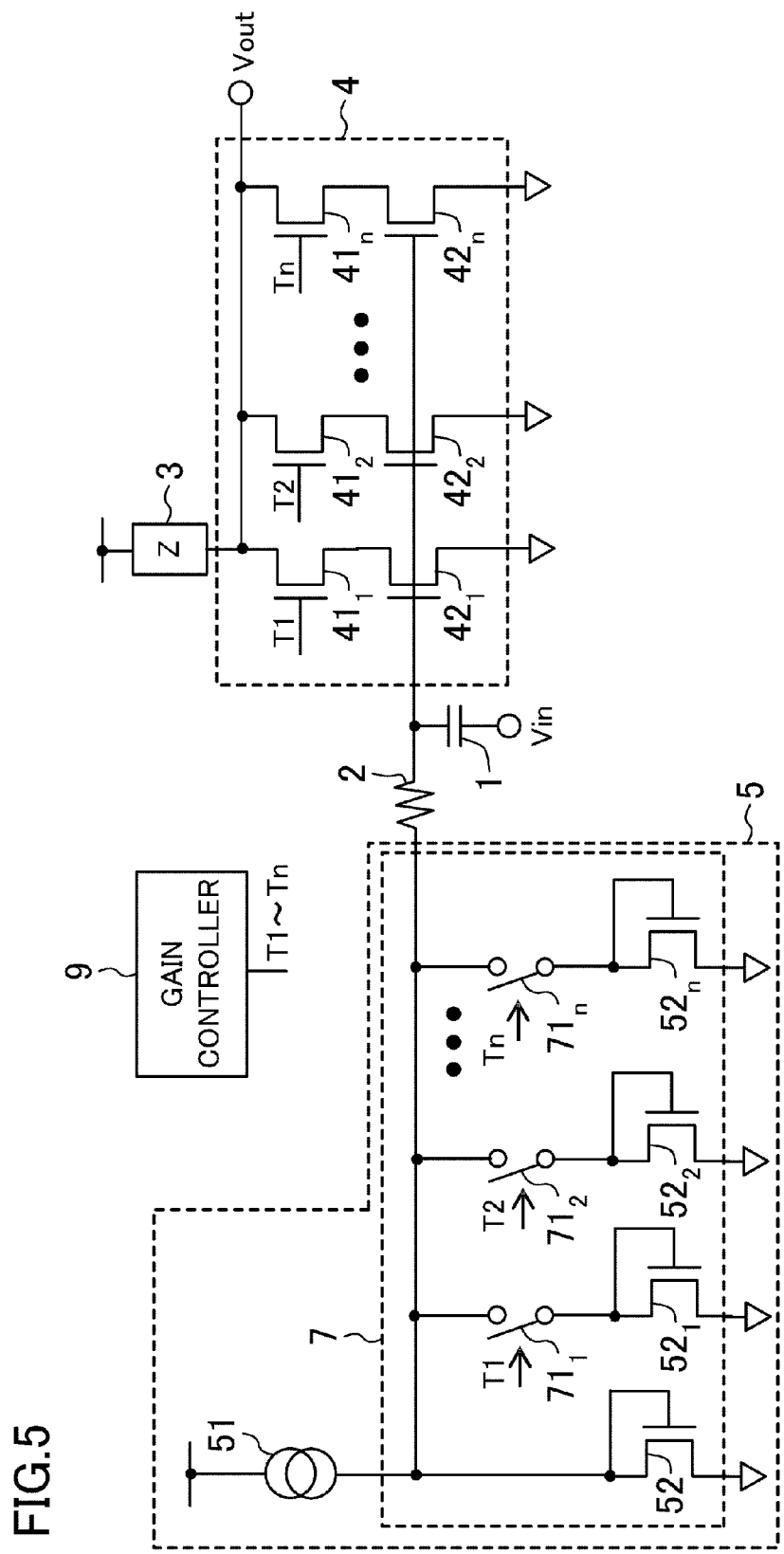
FIG. 5 is a circuit configuration diagram of a VGA according to the second embodiment.

FIG. 5 illustrates a circuit configuration of a VGA according to the second embodiment. The differences from the first embodiment will be described below.

The variable bias voltage generator 5 includes the constant current source 51 and a variable reference transistor circuit 7. The variable reference transistor circuit 7 includes a circuit in which n reference transistor circuits are coupled together in parallel, each having a reference transistor $52_i$ and a switch $71_i$ coupled together in series, and a reference transistor 52 coupled in parallel to the circuit. The reference transistor 52 may be omitted. The variable reference transistor circuit 7 and the amplifier transistors $42_i$ together form a current mirror circuit, and a bias current dependent on the transistor size ratio thereof is supplied to the variable amplifier unit 4 with respect to a reference current supplied from the constant current source 51.

The gain controller 9 provides control to decrease the variable bias voltage when the effective transistor size of the variable amplifier unit 4 is controlled so as to increase, and provides control to increase the variable bias voltage when the effective transistor size of the variable amplifier unit 4 is controlled so as to decrease. More specifically, the gain controller 9 outputs a control code Ti to control the cascode transistors $41_i$ and the switches $71_i$. That is, the control is provided such that the switch $71_i$ is also turned on when the cascode transistor $41_i$ is turned on, while the switch $71_i$ is also turned off when the cascode transistor $41_i$ is turned off.

FIG. 6 is a table illustrating the properties of the VGA according to this embodiment. It is assumed here that the number of control bits is seven, and that the amplifier transistor $42_i$ has a size weighed by a power of two (1 μm, 2 μm, 4 μm, 8 μm, 16 μm, 32 μm, and 64 μm). It is also assumed that the reference transistor 52 has a size of 10 μm, that the reference transistor $52_i$ has a size also weighed by a power of two (0.04 μm, 0.08 μm, 0.16 μm, 0.32 μm, 0.64 μm, 1.28 μm, and 2.56 μm), and that the transistor size of the variable reference transistor circuit 7 is variable within a range from 10 μm to 15 μm. The constant current source 51 supplies a current of 300 μA. The table shows the control code in gain modes 1, 8, 32, 64, and 127, the effective size of the amplifier transistors, the transistor size of the variable reference transistor circuit 7, the current density of the bias current which flows to the amplifier transistors $42_i$, the current consumption, the gain, and IIP3 when the load impedance unit 3 has a resistance of 100Ω. For the evaluation of IIP3, sinusoidal waves of 600 MHz and 610 MHz are simultaneously input, and calculations are performed using an output power of 600 MHz and an output power of 590 MHz corresponding to third-order distortion. The values of conventional technology listed for comparison with those of this embodiment are those disclosed in Patent Document 1.

Figure 7:
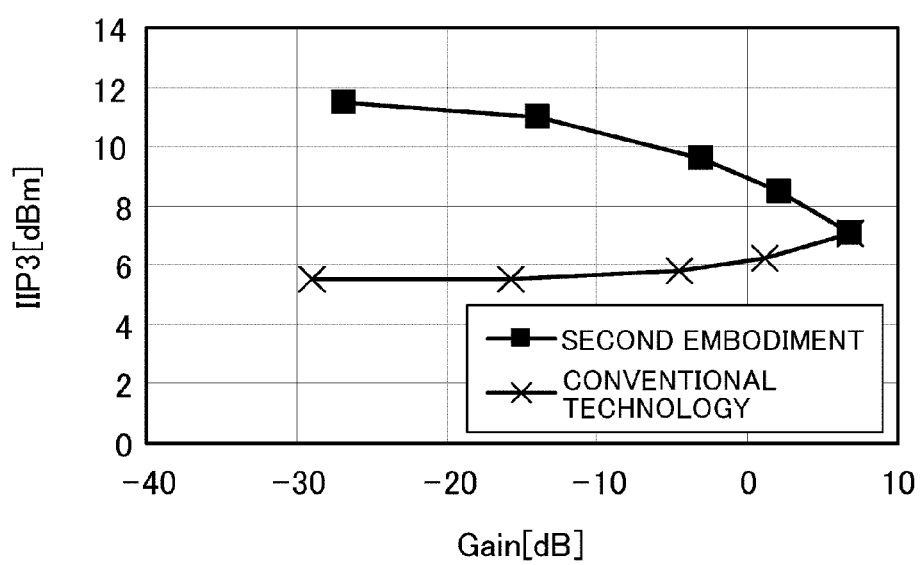
FIG. 7 is a graph illustrating a gain versus IIP3 characteristic of the VGA according to the second embodiment.

As seen from the table, the VGA according to this embodiment operates such that a lower gain causes a higher mirror ratio, and thus a higher current density. Accordingly, IIP3 in a lower gain mode is improved as compared to that of conventional technology. As shown in the graph of FIG. 7, a lower gain in this embodiment produces a larger effect of improving IIP3. More specifically, improvement of up to about 6 dB is achieved.

The number of the cascode transistors $41_i$ and the number of the switches $71_i$ may differ. It is only required that the variable amplifier unit 4 and the variable reference transistor circuit 7 be configured such that an increase of the effective transistor size of the variable amplifier unit 4 causes the variable bias voltage to decrease, and a decrease of the effective transistor size of the variable amplifier unit 4 causes the variable bias voltage to increase.

Although, in this embodiment, the variable amplifier unit 4 has been described as a common-source variable amplifier unit, the variable amplifier unit 4 may be implemented using a common-gate variable amplifier unit. Moreover, in a case of a differential circuit, the variable amplifier unit 4 may be implemented using a cross-coupled common-gate variable amplifier unit.

Third Embodiment

Figure 8:
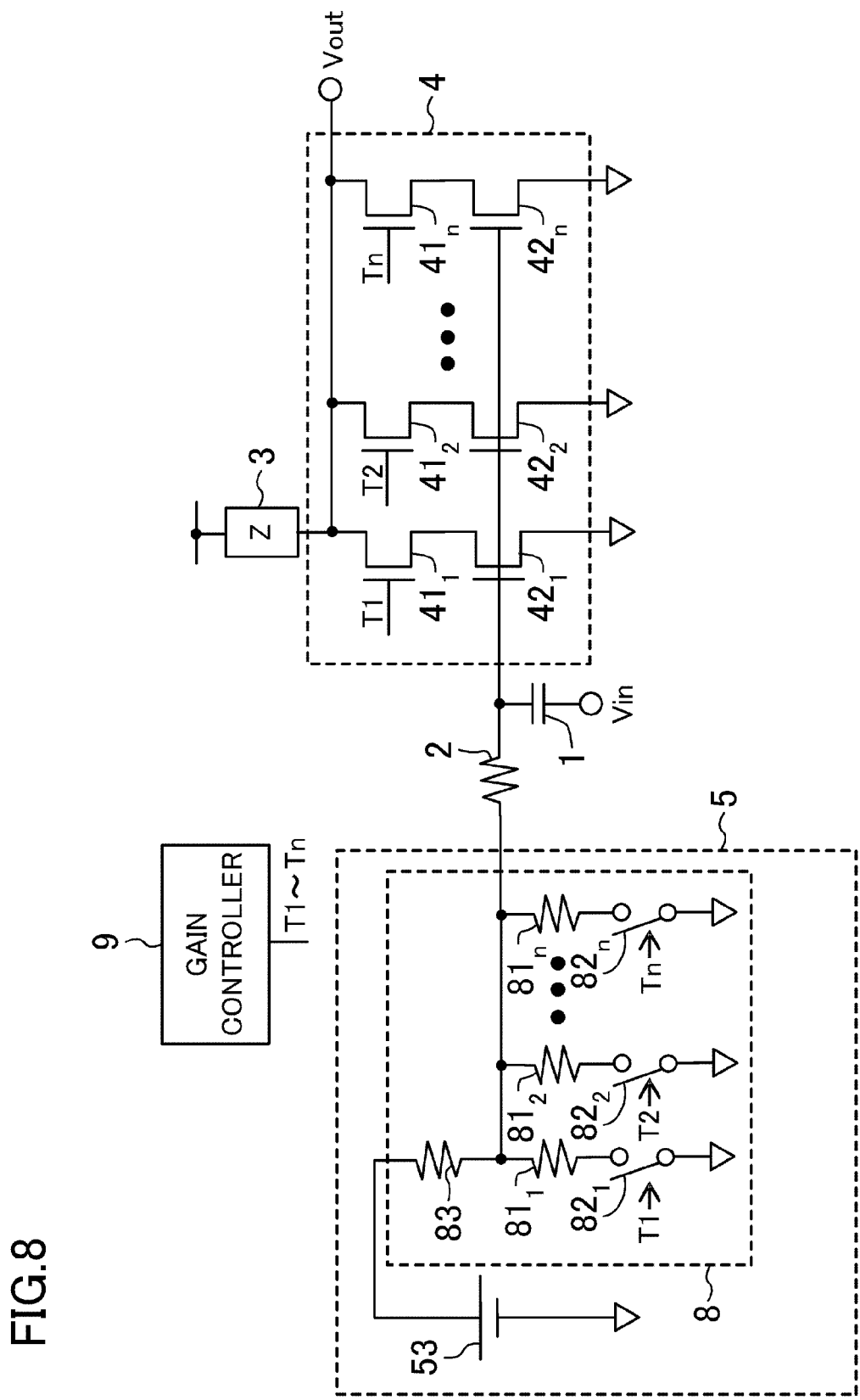
FIG. 8 is a circuit configuration diagram of a VGA according to the third embodiment.

FIG. 8 illustrates a circuit configuration of a VGA according to the third embodiment. The differences from the first embodiment will be described below.

Figure 9:
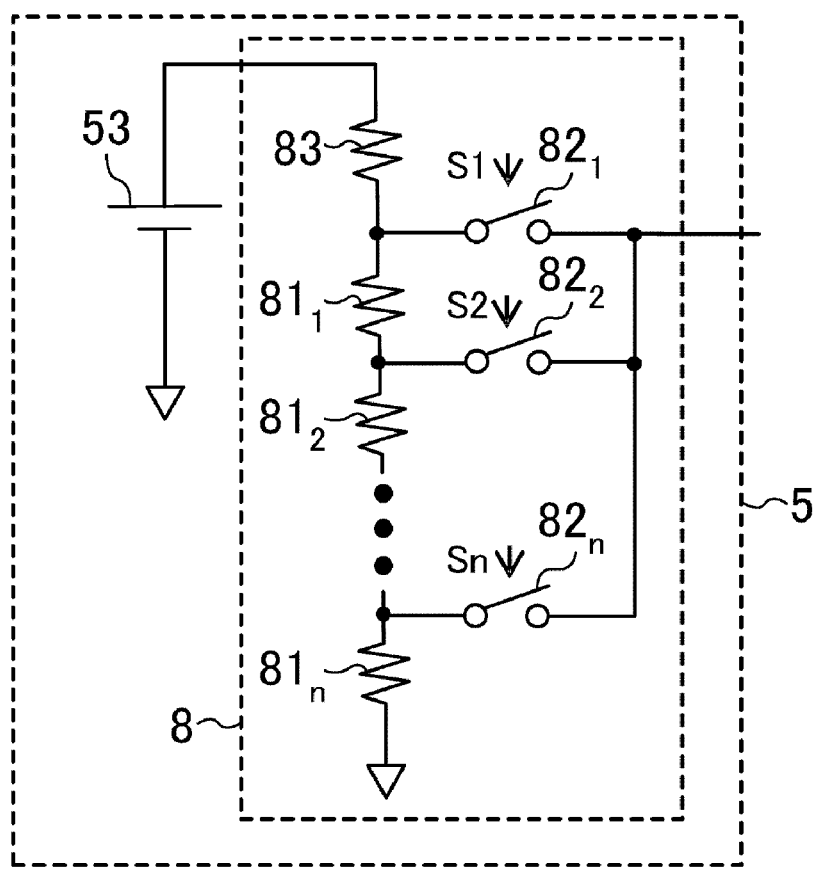
FIG. 9 is a diagram illustrating a variation of the variable bias voltage generator.

The variable bias voltage generator 5 includes a constant voltage source 53 and a variable voltage divider circuit 8. The variable voltage divider circuit 8 includes a circuit in which n resistor circuits are coupled together in parallel, each having a resistor $81_i$ and a switch $82_i$ coupled together in series, and a resistor 83 coupled in series to the circuit. The variable bias voltage is supplied as a voltage obtained by dividing the voltage supplied from the constant voltage source 53 by the resistor $81_i$ and the resistor 83. Note that all of the resistors $81_i$ may be coupled together in series in the variable voltage divider circuit 8. In such a case, as shown in FIG. 9, it is preferable that one end of the switch $82_i$ controlled by a control signal $S_i$ be used as an output terminal of the bias voltage.

Returning to FIG. 8, the gain controller 9 provides control to decrease the variable bias voltage when the effective transistor size of the variable amplifier unit 4 is controlled so as to increase, and provides control to increase the variable bias voltage when the effective transistor size of the variable amplifier unit 4 is controlled so as to decrease. More specifically, the gain controller 9 outputs a control code Ti to control the cascode transistors $41_i$ and the switches $82_i$. That is, the control is provided such that the switch $82_i$ is also turned on when the cascode transistor $41_i$ is turned on, while the switch $82_i$ is also turned off when the cascode transistor $41_i$ is turned off.

FIG. 10 is a table illustrating the properties of the VGA according to this embodiment. It is assumed here that the number of control bits is seven, and that the amplifier transistor $42_i$ has a size weighed by a power of two (1 μm, 2 μm, 4 μm, 8 μm, 16 μm, 32 μm, and 64 μm). It is also assumed that the resistor 83 has a resistance value of 100Ω, that the resistor $81_i$ has a resistance value weighed by a power of $2^{-1}$ (192 kΩ, 96 kΩ, 48 kΩ, 24 kΩ, 12 kΩ, 6 kΩ, and 3 kΩ), and that the divided voltage ratio is variable within a range from 0.938 to 0.999. Moreover, the constant voltage source 53 supplies a voltage of 594 mV, and the variable bias voltage is variable within a range from 557 mV to 593 mV. The table shows the control code in gain modes 1, 8, 32, 64, and 127, the effective size of the amplifier transistors, the variable bias voltage, the current density of the bias current which flows to the amplifier transistors $42_i$, the current consumption, the gain, and IIP3 when the load impedance unit 3 has a resistance of 100Ω. For the evaluation of IIP3, sinusoidal waves of 600 MHz and 610 MHz are simultaneously input, and calculations are performed using an output power of 600 MHz and an output power of 590 MHz corresponding to third-order distortion. The values of conventional technology listed for comparison with those of this embodiment are those disclosed in Patent Document 1.

Figure 11:
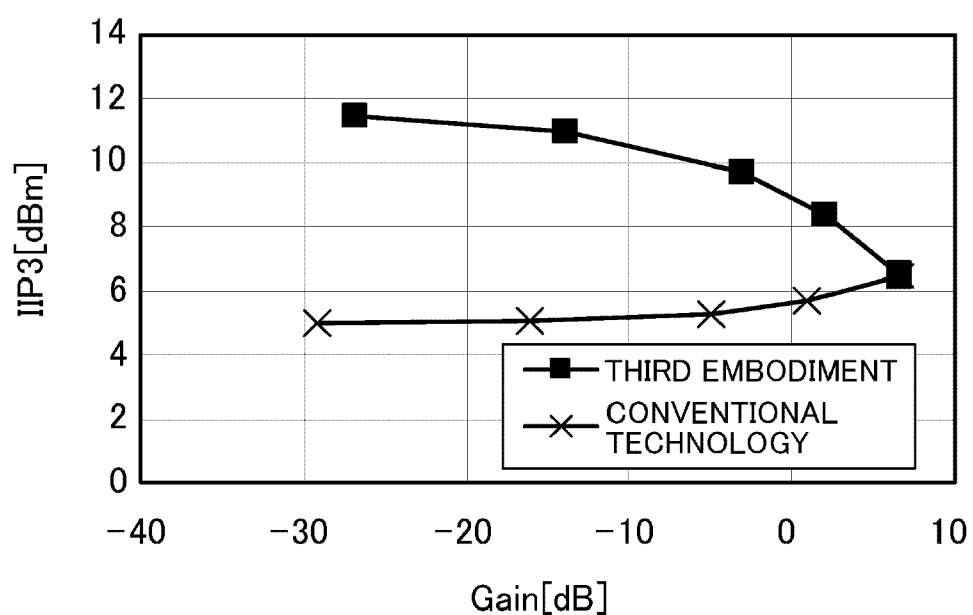
FIG. 11 is a graph illustrating a gain versus IIP3 characteristic of the VGA according to the third embodiment.

As seen from the table, the VGA according to this embodiment operates such that a lower gain causes a higher bias voltage, and thus a higher current density. Accordingly, IIP3 in a lower gain mode is improved as compared to that of conventional technology. As shown in the graph of FIG. 11, a lower gain in this embodiment produces a larger effect of improving IIP3. More specifically, improvement of up to about 6 dB is achieved.

The number of the cascode transistors $41_i$ and the number of the switches $82_i$ may differ. It is only required that the variable amplifier unit 4 and the variable voltage divider circuit 8 be configured such that an increase of the effective transistor size of the variable amplifier unit 4 causes the variable bias voltage to decrease, and a decrease of the effective transistor size of the variable amplifier unit 4 causes the variable bias voltage to increase. Moreover, the resistor 83 and the resistors $81_i$ function as bias resistors depending on setting of the resistance values thereof, and therefore the bias resistor 2 may be omitted.

Although, in this embodiment, the variable amplifier unit 4 has been described as a common-source variable amplifier unit, the variable amplifier unit 4 may be implemented using a common-gate variable amplifier unit. Moreover, in a case of a differential circuit, the variable amplifier unit 4 may be implemented using a cross-coupled common-gate variable amplifier unit.

Although the current consumption in a lower gain mode of the VGA according to each of the above example embodiments is higher than that of conventional technology, the current consumption is almost the same as that of conventional technology in a higher gain mode, in which the absolute value of the current consumption is high, thereby causing no practical problems to occur. In other words, conventional VGAs require a high current consumption for improving the distortion characteristic, whereas the VGA according to each of the above example embodiments can improve the distortion characteristic while reducing an increase of the current consumption.

Fourth Embodiment

Figure 12:
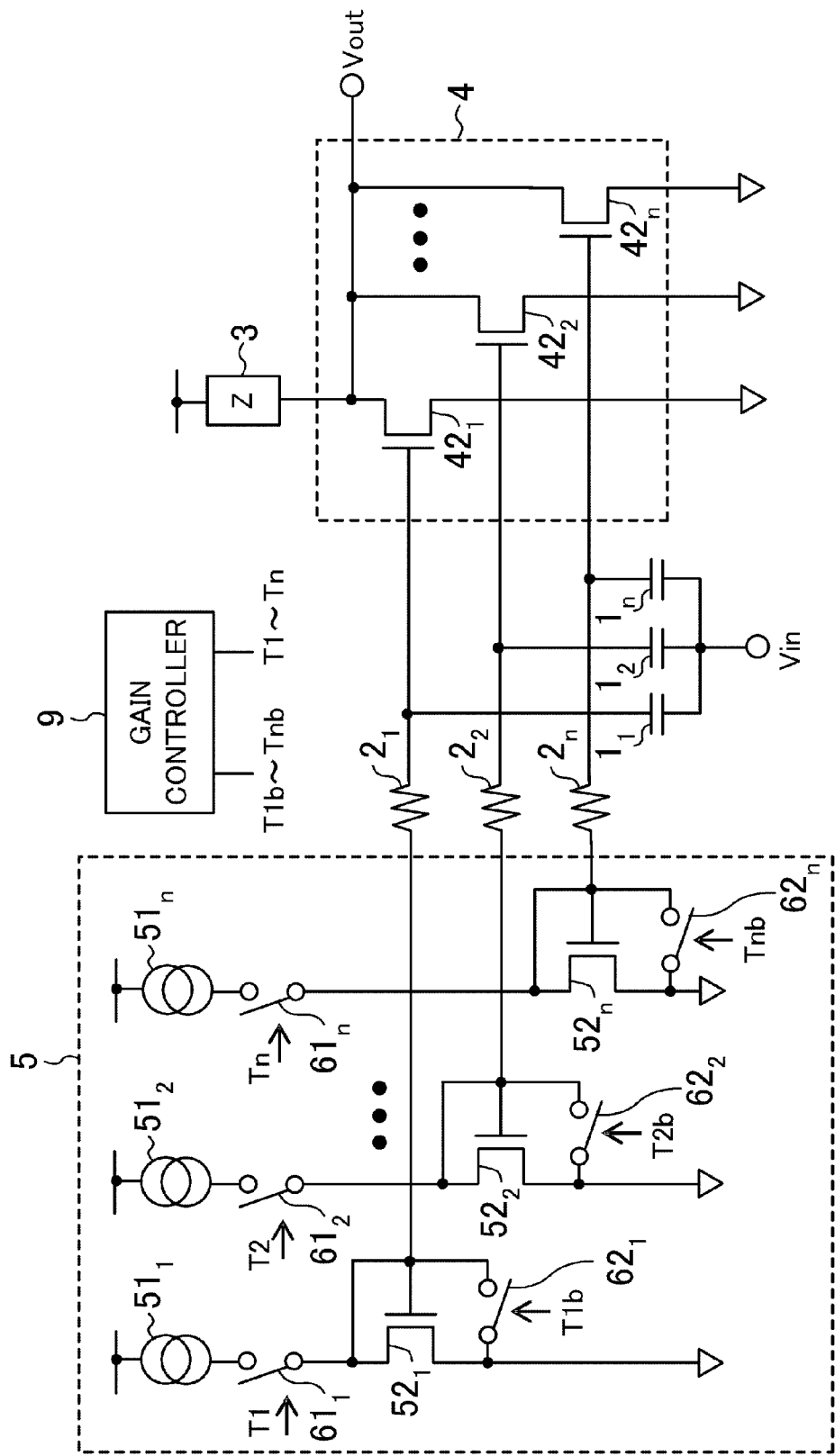
FIG. 12 is a circuit configuration diagram of a VGA according to the fourth embodiment.

FIG. 12 illustrates a circuit configuration of a VGA according to the fourth embodiment. A signal Vin is input through DC blocking capacitors $1_i$ to the variable amplifier unit 4, and is converted into current signals. The current signals are converted into a voltage signal Vout by a load impedance unit 3. Each input of the variable amplifier unit 4 is biased by a variable bias voltage supplied from a variable bias voltage generator 5 through a bias resistor $2_i$.

The variable amplifier unit 4 includes n amplifier transistors $42_i$. The variable bias voltage generator 5 includes n bias voltage generator circuits. Each of the bias voltage generator circuits includes a constant current source $51_i$, a reference transistor $52_i$, a switch $61_i$, and a switch $62_i$, which is coupled between the bias resistor $2_i$, and the ground, coupled together in series. The gain controller 9 controls, independently of one another, a plurality of outputs of the variable bias voltage generator 5. More specifically, the gain controller 9 outputs a control code Ti and an inverted code Tib thereof to respectively control the switches $61_i$ and $62_i$. That is, the control is provided such that the switch $62_i$ is turned off when the switch $61_i$ is turned on, while the switch $62_i$ is turned on when the switch $61_i$ is turned off.

Figure 13:
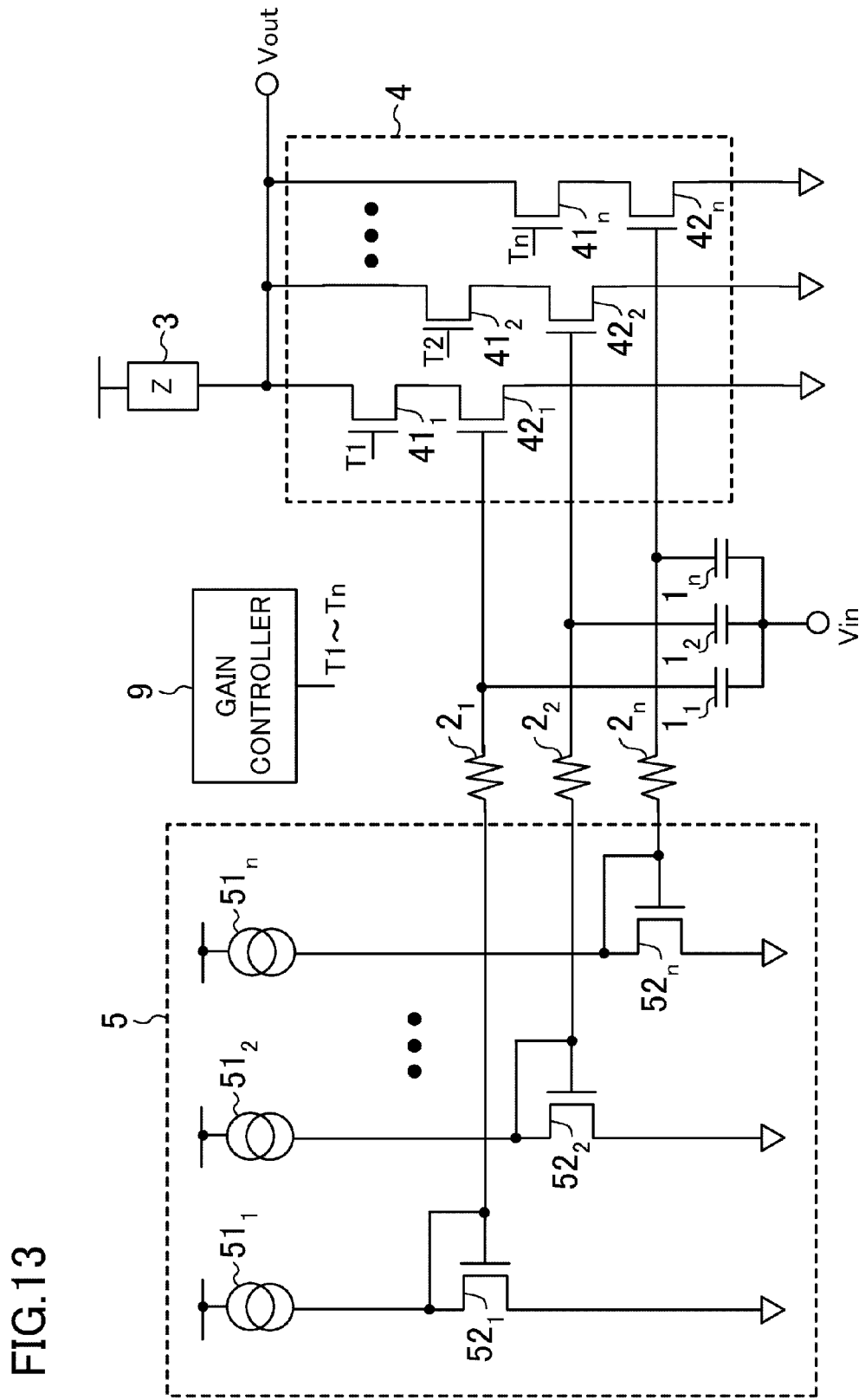
FIG. 13 is a circuit configuration diagram of a VGA according to a variation of the fourth embodiment.

The gain controller 9 may control, independently of one another, a plurality of outputs of the variable amplifier unit 4, instead of the plurality of outputs of the variable bias voltage generator 5. FIG. 13 illustrates a circuit configuration of a VGA according to a variation of this embodiment. The variable amplifier unit 4 includes n cascode circuits each having a cascode transistor $41_i$ and an amplifier transistor $42_i$ which are cascode coupled. The variable bias voltage generator 5 includes n bias voltage generator circuits each having a constant current source $51_i$ and a reference transistor $52_i$. The gain controller 9 controls, independently of one another, a plurality of outputs of the variable amplifier unit 4. More specifically, the gain controller 9 outputs a control code Ti to control the cascode transistor $41_i$.

FIG. 14 is a table illustrating the properties of the VGA according to this embodiment. It is assumed here that the number of control bits is seven, that the amplifier transistor $42_i$ has a size weighed by a power of two (1 µm, 2 µm, 4 µm, 8 µm, 16 µm, 32 µm, and 64 µm), and that the reference transistor $52_i$ has a size also weighed by a power of two (1 µm, 2 µm, 4 µm, 8 µm, 16 µm, 32 µm, and 64 µm). It is also assumed that the current source $51_i$ supplies a current with which the corresponding amplifier transistor $42_i$ operates in a linear region (30 µA, 29.8 µA, 29.5 µA, 28.8 µA, 27.6 µA, 25.1 µA, and 20 µA). The table shows the control code in gain modes 1, 7, 31, 63, and 127, the effective size of the amplifier transistors, the current consumption, the gain, and IIP3 when the load impedance unit 3 has a resistance of 100Ω. For the evaluation of IIP3, sinusoidal waves of 600 MHz and 610 MHz are simultaneously input, and calculations are performed using an output power of 600 MHz and an output power of 590 MHz corresponding to third-order distortion. The values of conventional technology listed for comparison with those of this embodiment are those disclosed in Non-Patent Document 1.

Figure 15:
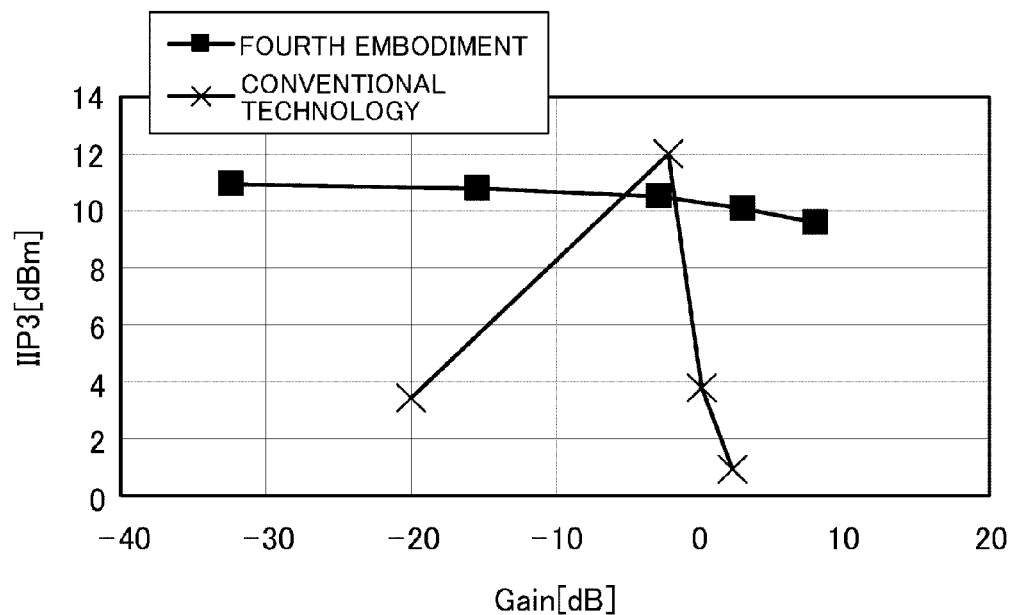
FIG. 15 is a graph illustrating a gain versus IIP3 characteristic of the VGA according to the fourth embodiment.
Figure 16:
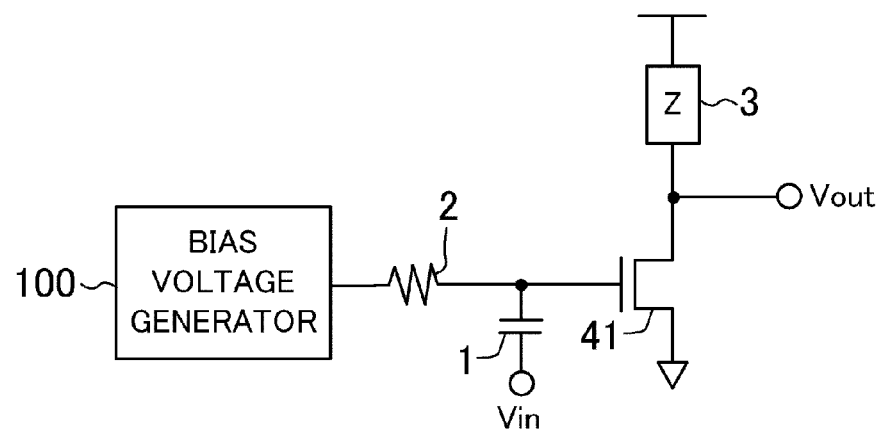
FIG. 16 is a circuit configuration diagram of a general source-grounded amplifier.
Figure 17:
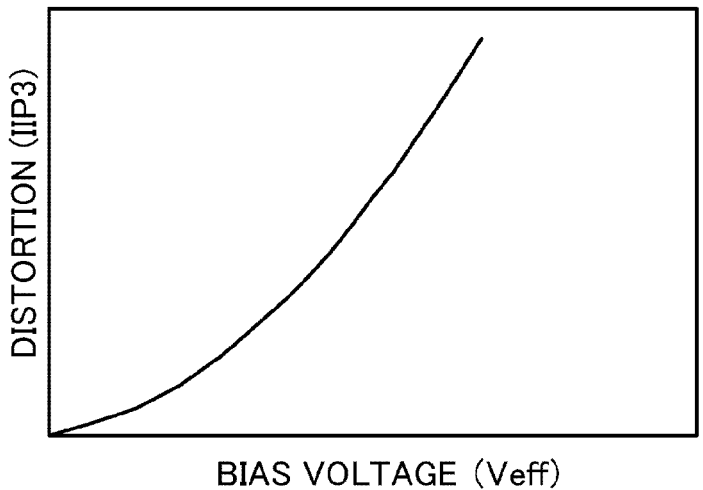
FIG. 17 is a graph illustrating a relationship between the bias voltage and the distortion characteristic.
Figure 18:
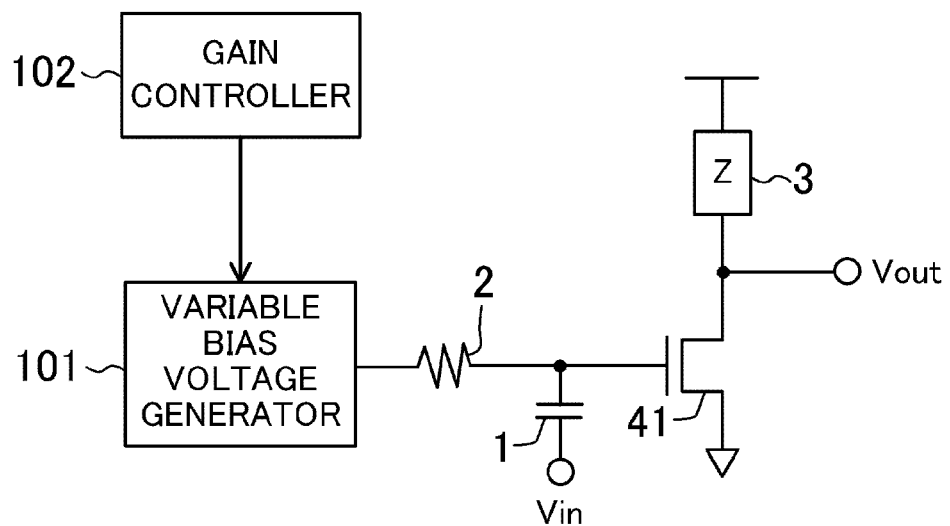
FIG. 18 is a circuit configuration diagram of a general VGA.

As seen from the table, the VGA according to this embodiment is configured such that bias currents which allow linear operations are independently supplied to the amplifier transistors $42_i$, and thus a decrease of the gain does not deteriorate IIP3. As shown in the graph of FIG. 15, the effect of improving IIP3 by this embodiment is significant except for some gain setting values. In conventional VGAs, bias currents are constant regardless of the sizes of amplifier transistors, and thus a lower gain mode does not ensure a suitable operating point for an amplifier, thereby causing the gain characteristic and the distortion characteristic to significantly deteriorate. That is, since conventional VGAs cannot be used in a lower gain mode, a wide variable-gain range cannot be achieved. On the contrary, in the VGA according to this embodiment, even though the current consumption is higher than that of conventional technology in a higher gain mode, the average current consumption over the all gain modes shows little difference. In other words, the VGA according to this embodiment can improve the distortion characteristic while reducing an increase of the current consumption.

Note that a VGA for high frequencies may include a bias inductor in place of the bias resistor 2 in each of the above embodiments. In addition, a part or all of the transistors of the VGA of each of the above embodiments may be bipolar transistors.

Although, in this embodiment, the variable amplifier unit 4 has been described as a common-source variable amplifier unit, the variable amplifier unit 4 may be implemented using a common-gate variable amplifier unit. Moreover, in a case of a differential circuit, the variable amplifier unit 4 may be implemented using a cross-coupled common-gate variable amplifier unit.

What is claimed is:

1. A variable gain amplifier, comprising:
    a plurality of direct current (DC) blocking capacitors configured to commonly receive an input signal at respective first terminals;
    a variable amplifier unit having a plurality of amplifier transistors configured to amplify outputs of respective second terminals of the plurality of DC blocking capacitors;
    a load impedance unit commonly coupled to a plurality of outputs of the variable amplifier;
    a plurality of bias resistors respectively having first terminals coupled to the respective second terminals of the plurality of DC blocking capacitors;
    a variable bias voltage generator having a plurality of bias voltage generator circuits each having a constant current source and a reference transistor coupled together in series, and each configured to apply a bias voltage to a second terminal of a corresponding one of the plurality of bias resistors; and
    a gain controller configured to control, independently of one another, a plurality of outputs of either the variable amplifier unit or the variable bias voltage generator.

* * * * *